United States Patent
Montgomery et al.

(10) Patent No.: US 7,817,909 B2
(45) Date of Patent: Oct. 19, 2010

(54) OPTICAL DEVICE AND LIGHT SOURCE

(75) Inventors: David James Montgomery, Oxford (GB); Grant Bourhill, Stow-On-The-Wold (GB)

(73) Assignee: Sharp Kabushiki Kaisha, Osaka (JP)

( * ) Notice: Subject to any disclaimer, the term of this patent is extended or adjusted under 35 U.S.C. 154(b) by 493 days.

(21) Appl. No.: 11/793,438

(22) PCT Filed: Dec. 19, 2005

(86) PCT No.: PCT/JP2005/023698

§ 371 (c)(1), (2), (4) Date: Feb. 19, 2008

(87) PCT Pub. No.: WO2006/068264

PCT Pub. Date: Jun. 29, 2006

(65) Prior Publication Data

US 2008/0279541 A1    Nov. 13, 2008

(30) Foreign Application Priority Data

Dec. 21, 2004  (GB) ................................ 0427883.4

(51) Int. Cl.
- G03B 15/02 (2006.01)
- G03B 15/06 (2006.01)
- G03B 19/00 (2006.01)
- G02B 3/08 (2006.01)
- G02B 27/10 (2006.01)
- G02B 5/32 (2006.01)
- F21V 3/00 (2006.01)
- F21V 5/00 (2006.01)

(52) U.S. Cl. .................. 396/62; 396/175; 396/429; 359/19; 359/742; 359/743; 359/619; 362/244; 362/311.01; 362/311.06

(58) Field of Classification Search .................. 396/62
See application file for complete search history.

(56) References Cited

U.S. PATENT DOCUMENTS 3,732,417 A    5/1973    Nordquist .................. 362/309

(Continued)

FOREIGN PATENT DOCUMENTS

| EP | 0 756 195 | 6/2006 |
|----|-----------|--------|
| GB | 818229 | 8/1959 |
| GB | 1144182 | 3/1969 |
| GB | 1391677 | 4/1975 |
| GB | 2258659 | 2/1993 |
| JP | 2003-331612 | 11/2003 |
| WO | WO-95/27171 | 10/1995 |
| WO | WO-97/38352 | 10/1997 |
| WO | WO-99/50596 | 10/1999 |

OTHER PUBLICATIONS

International Search Report dated Jul. 7, 2006, directed to counterpart International Application No. PCT/JP2005/023698.

\* cited by examiner

*Primary Examiner*—Melissa J Koval
(74) *Attorney, Agent, or Firm*—Morrison & Foerster LLP

(57) ABSTRACT

An optical device directs light from a light source to a region of space, such as the field of view of a camera when the optical device is used as a camera flash unit. This device includes a first optical element which converges light from the light source towards an inner portion of the region to be illuminated and a second optical element which diverges part of the light from the first element outwardly towards an outer portion of the region to be illuminated so as to achieve adequate central illumination with improved uniformity of illumination across the region to be illuminated. The second optical element may have a concave multiple-faceted surface comprising plane facets in the shape of an open-base inverted truncated pyramid, contiguous sector-shaped facets, at least some of which are concave, or a face divided into an elongate portion disposed between first and second diverging portions.

36 Claims, 11 Drawing Sheets

U.S. PATENT DOCUMENTS

| | | | |
|---|---|---|---|
| 4,462,063 A | 7/1984 | English | 362/11 |
| 4,510,560 A | 4/1985 | Negishi | 362/299 |
| 4,737,896 A | 4/1988 | Mochizuki | 362/301 |
| 5,160,192 A | 11/1992 | Sugawara | 362/16 |
| 5,174,649 A * | 12/1992 | Alston | 362/244 |
| 5,553,174 A | 9/1996 | Snyder | 385/15 |
| 5,615,394 A | 3/1997 | Albrecht | 396/6 |
| 5,636,057 A | 6/1997 | Dick et al. | 359/625 |
| 5,769,521 A | 6/1998 | Osawa et al. | 362/27 |
| 5,778,264 A | 7/1998 | Kean | 396/174 |
| 5,815,293 A * | 9/1998 | Komma et al. | 359/19 |
| 6,088,540 A | 7/2000 | Leidig et al. | 396/155 |
| 6,283,613 B1 | 9/2001 | Schaffer | 362/245 |
| 6,496,650 B2 | 12/2002 | Shimizu | 396/62 |
| 6,771,898 B2 | 8/2004 | Bean et al. | 396/62 |
| 2001/0028792 A1 | 10/2001 | Shimizu | 381/374 |
| 2002/0009297 A1* | 1/2002 | Tanabe | 396/62 |
| 2002/0085390 A1 | 7/2002 | Kiyomoto et al. | 362/555 |
| 2004/0061945 A1* | 4/2004 | Wolfe | 359/619 |
| 2004/0131157 A1 | 7/2004 | Stevanovic et al. | 378/145 |

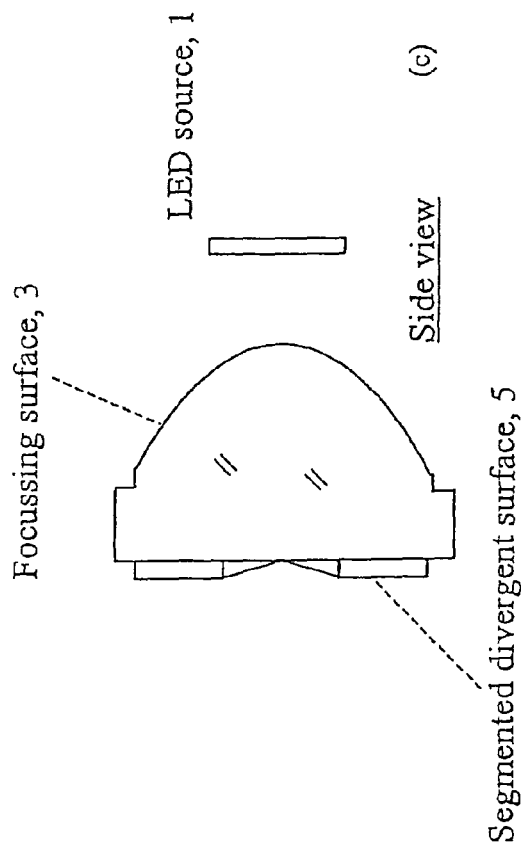
| | Brightness | Uniformity |
|---|---|---|
| LED source alone | 1 | 42% |
| LED + Focussing surface | 1.8 | 8% |
| LED + Focussing & divergent surface | 1.4 | 54% |
(d)
(c) Side view
Focussing surface, 3
Segmented divergent surface, 5
LED source, 1
Figure 4
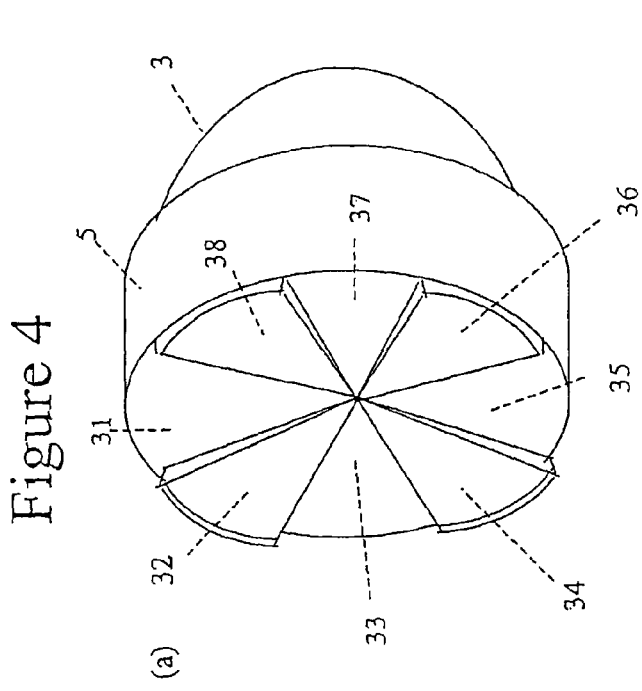
(a)
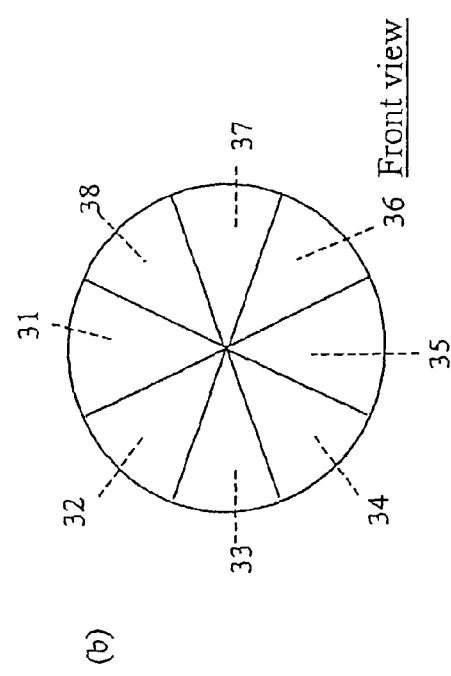
(b) Front view

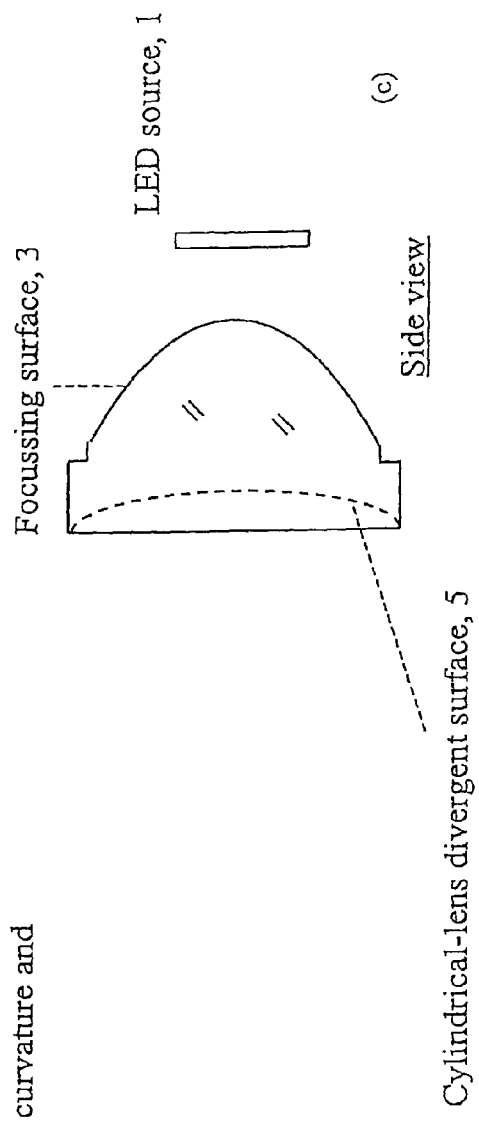
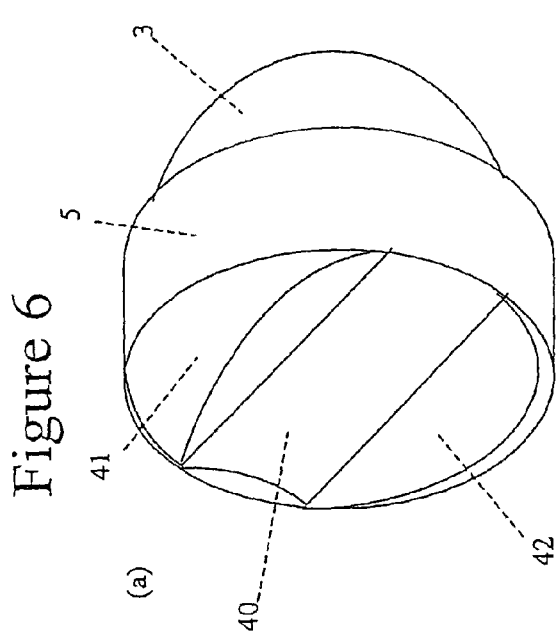
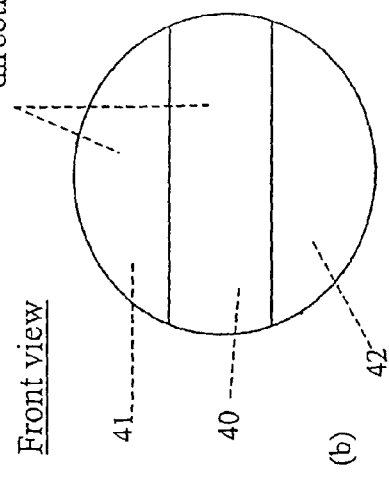
Figure 6

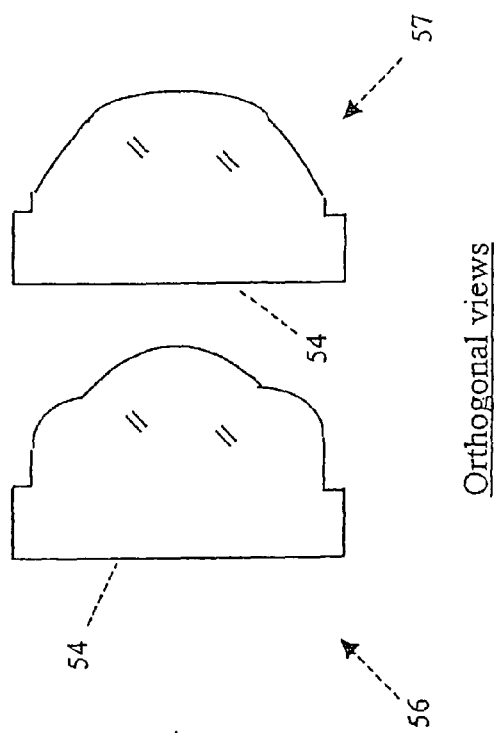
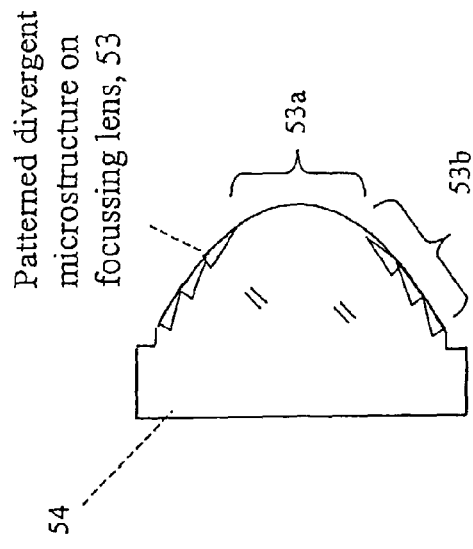
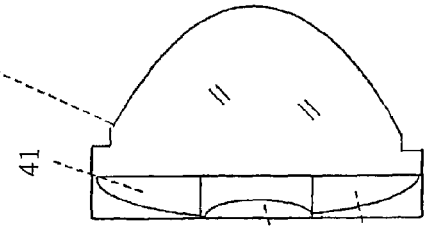
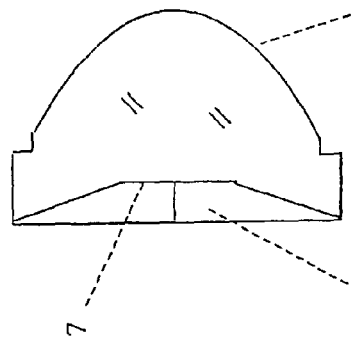
Figure 8

Figure 10
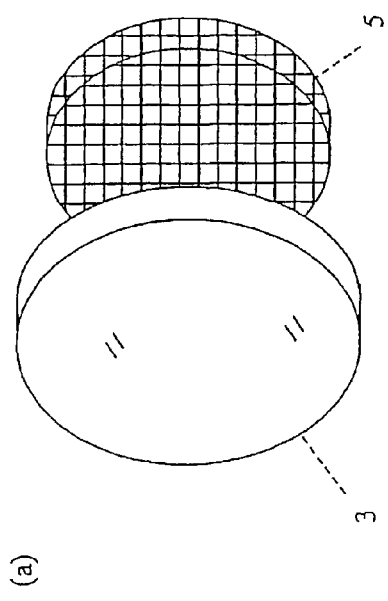
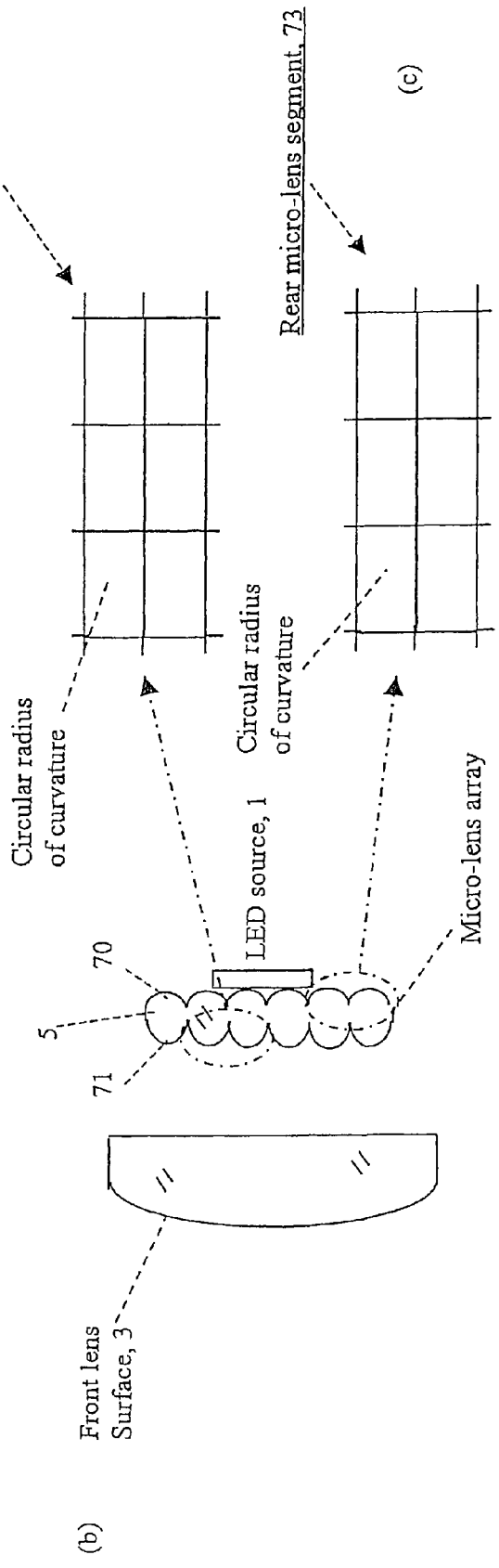
| | Brightness | Uniformity |
|---|---|---|
| LED source alone | 1 | 42% |
| LED + Focussing surface | 1.8 | 8% |
| LED + Focussing & divergent surface | 1.4 | 56% |
(d)

OPTICAL DEVICE AND LIGHT SOURCE

REFERENCE TO RELATED APPLICATIONS

This application is a national stage application under 35 USC 371 of International Application No. PCT/JP2005/023698, filed Dec. 19, 2005, which claims the priority of United Kingdom Application No. 0427883.4, filed Dec. 21, 2004, the contents of both of which prior applications are incorporated herein by reference.

FIELD OF THE INVENTION

The present invention relates to an optical device and to a light source including such an optical device. Such a device may be used as an attachment for or as a part of a light source in order to improve the uniformity of illumination of an area by the light source. Such a device and light source may be used in an apparatus including a camera, such as a mobile ("cellular") telephone incorporating camera facilities. The present invention also relates to such an apparatus. However, such devices and light sources may be used in other applications, such as compact torches and spotlights.

BACKGROUND OF THE INVENTION

Known types of lens structures used in flash units for (digital or film) cameras are frequently "circular" lenses of normal or Fresnel type with circular or rectangular outlines. Although the brightness provided by such a flash unit may be relatively high, the uniformity of illumination across the field of view of the camera may be relatively low. The effect of such poor uniformity of illumination is especially pronounced in wide angle photographs. This may result in images of objects to the sides of the field of view and in the corners thereof being relatively dim or even invisible in the photograph.

Part of the reason for this is that camera fields of view are generally rectangular in shape whereas optics tend to be circular. Another part of the reason results from the emission profile of the flash unit or other light source. In the case of an isotropic light emitter without any optical system, the light flux at the corner a rectangular plane a fixed distance from the source is given by $\cos^3\theta$ that of the flux at the centre of the rectangular plane, where the angle $\theta$ measured at the light emitter is the angle between the normal to the centre of the rectangular plane and a line from the light emitter to the corner of the rectangular plane. In a typical example where the angle $\theta$ is approximately 37°, the resulting uniformity (ratio of flux in the corner to flux at the centre) is approximately 51%. In the case of a Lambertian light emitter such as a light emitting diode (LED) emitter, the uniformity is equal to $\cos^4\theta$ and, in the specific example of $\theta=37°$, is approximately 42%.

In general, as is known, it is possible with narrower fields of view to obtain good uniformity of illumination using only converging optical elements. However, for wider fields, this is more difficult when the illumination from the light source on its own falls off at high angles, i.e. source only illumination becomes significantly less than that at the centre. For older types of flash, using flashbulbs, the source is most conveniently modelled as isotropic and illumination does not fall off very fast with angle onto a plane. However, for surface sources like LEDs, which are most conveniently modelled as Lambertian sources, illumination falls off much faster with angle and this makes it harder to obtain good uniformity at high angles. LEDs have better power characteristics than flash bulbs and thus are more likely to be used, for example, in mobile devices. Also, cameras in mobile devices are unlikely to have mechanical zooms or detachable lenses so that the fixed field of such a mobile camera is usually set to give a general-use field angle which may typically be around 70-75° or greater diagonal field. In addition, it is useful for the illumination plane to be somewhat larger than the actual camera field, to allow for design uncertainty and the fact the flash and camera are not in the same place on the device (parallax).

Lenses are generally provided in camera flash units in order to improve the brightness of illumination. Such arrangements improve the brightness in the centre of the field of view. However, the focussing nature of such lenses tends to direct light away from the edges of the field of view towards the centre thereof, increasing the central brightness but inevitably reducing uniformity of illumination across the field of view, especially for wide fields with Lambertian illuminators.

In this patent, a curved lens surface shall be referred to as "spherical" if the Cartesian (X, Y, Z) shape of the curve of the surface satisfies the equation (Z is known as the sag of the surface):

$$Z = R - \sqrt{R^2 - X^2 - Y^2}$$

where R is the radius of curvature of the surface.

An "aspheric" surface is defined by:

$$Z = \frac{(X^2+Y^2)/R}{1+\sqrt{1-(1+K)(X^2+Y^2)/R^2}} + \sum_p A_p(X^2+Y^2)^p$$

where R is the radius of curvature at the centre, K is the conic constant and $A_p$ are higher order coefficients for integer values of $p>1$.

An "asymmetric" surface is defined by the above equation where $(X^2+Y^2)$ is replaced by $(nX^2+mY^2)$ where $n\neq0$, $m\neq0$ and $n\neq m$.

A "cylindrical" surface is where either n or m is zero.

An "anamorphic" surface is where the function describing the surface is other than above and may be the sum of two different aspheric, cylindrical or asymmetric functions or a mixture of these.

A "plane" surface or "optically flat surface" is a spherical surface where R is infinite.

Unless a type is specifically mentioned, a reference to a lens surface in the description may refer to any of the above types of surface.

U.S. Pat. No. 5,615,394 discloses the use of anamorphic lenses for camera flash assemblies. This arrangement has at least one surface of a lens assembly whose shape is modified away from a standard lens shape so as to control illumination. Such an arrangement uses all convergent elements and has problems with wide fields or Lambertian LED sources.

U.S. Pat. No. 5,160,192 discloses the use of an asymmetric ellipsoidal reflector (two identical half-ellipsodial mirrors arranged so that their axes are in different places with a flat mirror making up the gap) behind a flash bulb and a Fresnel lens condenser in order to improve the uniformity of illumination of a flash unit for a camera. This arrangement has all convergent elements and so has problems with wide fields or Lambertian LED sources. However, rear-mounted mirrors are of no use to surface emitters such as LEDs. Also, such an arrangement is of large size and is difficult to mount in a mobile device U.S. Pat. No. 4,462,063 discloses the use of a spherical and aspheric lens assembly around a flash bulb in order to improve uniformity of illumination. Again, all convergent elements are used and this has problems with wide fields or Lambertian LED sources. This arrangement is specific to lamp bulbs, is of large size and is difficult to mount in a mobile device U.S. Pat. No. 6,088,540 discloses an arrangement including an additional element utilising two surfaces, one a normal converging surface and one a Fresnel-like surface utilising total internal reflection (TIR) in order to improve focussing power. Such an arrangement provides high brightness but poor uniformity of illumination, with the production of one or more "bright spots" being visible. This arrangement is specific to flashlamps and requires a linear volume source and back reflector. The TIR element is designed to bring high angle light more forward and in this respect it is a convergent element.

U.S. Pat. No. 5,778,264 discloses a mirror system for widening an illumination area. However, such an arrangement is relatively bulky and is inconvenient or unsuitable for relatively compact portable or mobile devices. Such an arrangement is in the form of a large area adapter, is bulky and is difficult to apply to a small mobile device. Further, it does not improve brightness of illumination.

US 20020009297, US 20010028792, U.S. Pat. No. 6,496,650, U.S. Pat. No. 6,771,898 and EP 0756195 disclose various techniques for changing the focus of a flash beam. These mainly concentrate on changing the illumination area in response to a camera zoom. US 20020009297 describes a switching lens system for altering the divergence of the light. US20010028792, U.S. Pat. No. 6,496,650 & U.S. Pat. No. 6,771,898 also describe a shifting convergent lens system. EP0756195 describes a system whereby the flash fires twice to ascertain the best illumination parameters and these are sent to the flash unit. All of these arrangements concern modifications to existing all-convergent optical system designs with the inherent issues mentioned above. Adaptable flash zooms are more complex technically and difficult to apply to small mobile devices.

GB 1 391 677 discloses an optical device comprising a converging reflector and a diverging element formed by a four-sectored prism arrangement.

GB 818,229 discloses a cinema projector having a light source with a condensing system. A cylindrically diverging lens followed by a cylindrically converging lens with the axes parallel is provided within the condensing system.

U.S. Pat. No. 5,769,521 discloses an arrangement for homogenising laser radiation. The arrangement comprises a "lenticular" in the form of "acentric" lens segments which are optically converging. This is followed by a converging "collecting" lens.

U.S. Pat. No. 5,553,174 discloses an arrangement for circularising a light beam from a laser diode. The arrangement comprises a collimating lens followed by a cylindrically diverging minilens.

WO 97/38352 discloses a projector light source. A diverging lens is disposed ahead of a converging condensing lens. The diverging lens has a concave surface with peripheral regions of lower curvature than the central region.

GB 1,144,182 discloses an arrangement for homogenising a laser beam while maintaining its collimation. The device comprises two aspheric lenses. The first is largely diverging from the centre of the laser beam so as to provide more uniform illumination on the second lens. The second lens then re-collimates the light. All optical paths through the device have the same optical length so as to preserve the wavefront shape of the incident light.

U.S. Pat. No. 6,283,613 discloses an LED overhead traffic signal. In an array of LEDs, each LED is provided with a conical reflector and what is referred to as a Fresnel "lens", although this latter device appears to be a Fresnel prism. The purpose of this device is effectively to deviate light downwardly.

JP 2003-331612 discloses an LED vehicle light. Each LED is disposed at one end of a cylindrical reflector. The outputs of the reflectors pass through converging Fresnel lenses and converging lenses.

GB 2 258 659 discloses a light source for a barcode reader. The light source comprises one or more LEDs with the or each LED being disposed behind a one dimensional converging lens which differs from having a cylindrical curvature in that the curvature varies with distances from the longitudinal axis. This is followed by a semi-cylindrical lens having a radius of curvature which varies along its longitudinal axis. Thus, both lenses are convergent.

U.S. Pat. No. 4,737,896 discloses a backlight for an LCD TV. The backlight comprises a light source at the focus of a converging lens, which thus outputs a parallel light beam. This light beam is reflected perpendicularly by a microprism array to a "scattering" surface for supplying diffuse light to the LCD.

U.S. Pat. No. 4,510,560 discloses a surface light source intended to provide uniform illumination over a working surface. FIG. 16 of this document illustrates a flat output element having an internal surface of microprism structure. Below the centre of this is a light source with a concave converging mirror to reflect light away from the output surface. Below this structure is a curved reflecting structure for providing uniform illumination of the microprism surface, which then redirects output light. Directly below the light source is a hole in the reflecting structure. The edges of the hole are convexly reflective and hence diverging so as to reflect light to the centre of the output surface to fill the shadow caused by the small concave mirror.

US 2004/0131157 discloses an LED light source for use in setting up an X-ray machine. The LEDs have integral converging lenses and some embodiments have parabolic or ellipsoidal reflectors which are also converging. FIG. 17 of this document shows what appears to be a concavo-convex lens and FIG. 18 of this document shows a diverging lens.

SUMMARY OF THE INVENTION

According to a first aspect of the invention, there is provided an optical device for directing light from a light emitter, located at a first predetermined position with respect to the device, to a predetermined two-dimensional region of space, located at a second predetermined position with respect to the device, the device comprising a first optical element for converging light incident thereon towards an inner portion of the region, characterised by comprising a refractive second optical element for diverging part of the light incident thereon outwardly towards at least one outer portion of the region, the second element having a concave multi-facetted surface comprising plane facets in the shape of an open-base inverted truncated pyramid.

According to a second aspect of the invention, there is provided an optical device for directing light from a light emitter, located at a first predetermined position with respect to the device, to a predetermined two-dimensional region of space, located at a second predetermined position with respect to the device, the device comprising a first optical element for converging light incident thereon towards an inner portion of the region, characterised by comprising a refractive second optical element for diverging part of the light incident thereon outwardly towards at least one outer portion of the region, the second element having a multi-facetted surface comprising a plurality of contiguous sector-shaped facets, at least some of which are concave.

The concave facets may be of at least two different radiuses of curvature.

The concave facets may have at least two different centres of curvature.

Some of the facets may be convex.

At least one of the facets may be plane.

At least some of the facets may be cylindrical.

According to a third aspect of the invention, there is provided an optical device for directing light from a light emitter, located at a first predetermined position with respect to the device, to a predetermined two-dimensional region of space, located at the second predetermined position with respect to the device, the device comprising a first optical element for converging light incident thereon towards an inner portion of the region, characterised by comprising a refractive second optical element for diverging part of the light incident thereon outwardly towards at least one outer portion of the region, the second element having a face divided into an elongate portion disposed between first and second diverging portions.

The elongate portion may be diverging. The elongate portion may be cylindrically concave with a cylinder axis substantially parallel to the longitudinal direction of the elongate portion.

The elongate portion may be plane.

The first and second portions may be cylindrically concave. The first and second portions may comprise parts of a common cylindrical surface. The first and second portions may have cylindrical axes substantially perpendicular to the longitudinal direction of the elongate portion.

The first and second portions may comprise arrays of grooves extending substantially perpendicularly to the longitudinal direction of the elongate portion. The groves may be substantially contiguous. The groves may have substantially triangular cross-sections.

The first and second elements may be formed in a single piece of refractive material. The first and second elements may be formed in first and second surfaces of the piece. As an alternative, the first and second elements may be formed in a common surface of the piece. One of the first and second elements may comprise a sub-structure of the other of the first and second elements.

At least one of the first and second elements may have a controllable variable optical performance for varying the size of the predetermined two-dimensional region of space. The at least one of the first and second elements may comprise a liquid crystal lens. As an alternative, the at least one of the first and second elements may comprise a lens which is substantially index-matched to an axis of a liquid crystal layer whose optic axis azimuth is controllable.

According to a fourth aspect of the invention, there is provided an optical device for directing light from a light emitter, located at a first predetermined position with respect to the device, to a predetermined two-dimensional region of space, located at a second predetermined position with respect to the device, the device comprising a first optical element for converging light incident thereon towards an inner portion of the region, characterised by comprising a reflective second optical element for diverging part of the light incident thereon outwardly towards at least one outer portion of the region via the first optical element.

The second element may be specularly reflective.

The second element may comprise part of an externally reflective generally toroidal surface.

The first element may have a controllable variable optical performance for varying the size of the predetermined two-dimensional region of space. The first element may comprise a liquid crystal lens. As an alternative, the first element may comprise a lens which is substantially index-matched to an axis of a liquid crystal layer whose optic axis azimuth is controllable.

The second element may be arranged to diverge the part of the incident light towards a plurality of outer portions of the region.

The region may be generally rectangular. The outer portions may comprise corner portions of the generally rectangular region.

The first element may be a focusing element.

The first element may be a refractive element. The first element may have a convex surface.

The first element may comprise a holographic optical element.

According to a fifth aspect of the invention, there is provided a light source comprising a device according to any one of the first to fourth aspects of the invention and at least one light emitter.

The first element may be disposed in a light path between the at least one light emitter and the second element.

The at least one light emitter may comprise a Lambertian emitter, such as at least one light emitting diode.

The source may comprise a camera flash unit.

According to a sixth aspect of the invention, there is provided an apparatus comprising a source according to the fifth aspect of the invention and a camera.

The apparatus may comprise a mobile or cellular telephone or a mobile personal digital assistant PDA.

It is thus possible to provide a device which may be used in a light source to provide good uniformity of illumination throughout a desired field of view and good brightness at the centre of the field of view, such as a plane some distance from the light source. The use of a divergent optical element permits increased control of illumination over wider fields and facilitates the use of, for example, substantially Lambertian LED sources as may be used in mobile devices. A compact device without moving parts can be provided. Such a device may be small and light and may, for example, be an integral part of a mobile device so that it is unnecessary to carry an adaptor as a separate item.

BRIEF DESCRIPTION OF THE DRAWINGS

The invention will be further described, by way of example, with reference to the accompanying drawings, in which:

FIG. 4 is a diagram illustrating an optical device and a light source constituting second embodiments of the invention;

FIG. 6 is a diagram illustrating an optical device and a light source constituting third embodiments of the invention;

FIG. 8 is a diagram illustrating how first and second elements of embodiments of the invention may be combined within a single surface;

FIG. 10 is a diagram illustrating a comparative example of an optical device.

DETAILED DESCRIPTION OF THE INVENTION

Figure 1:
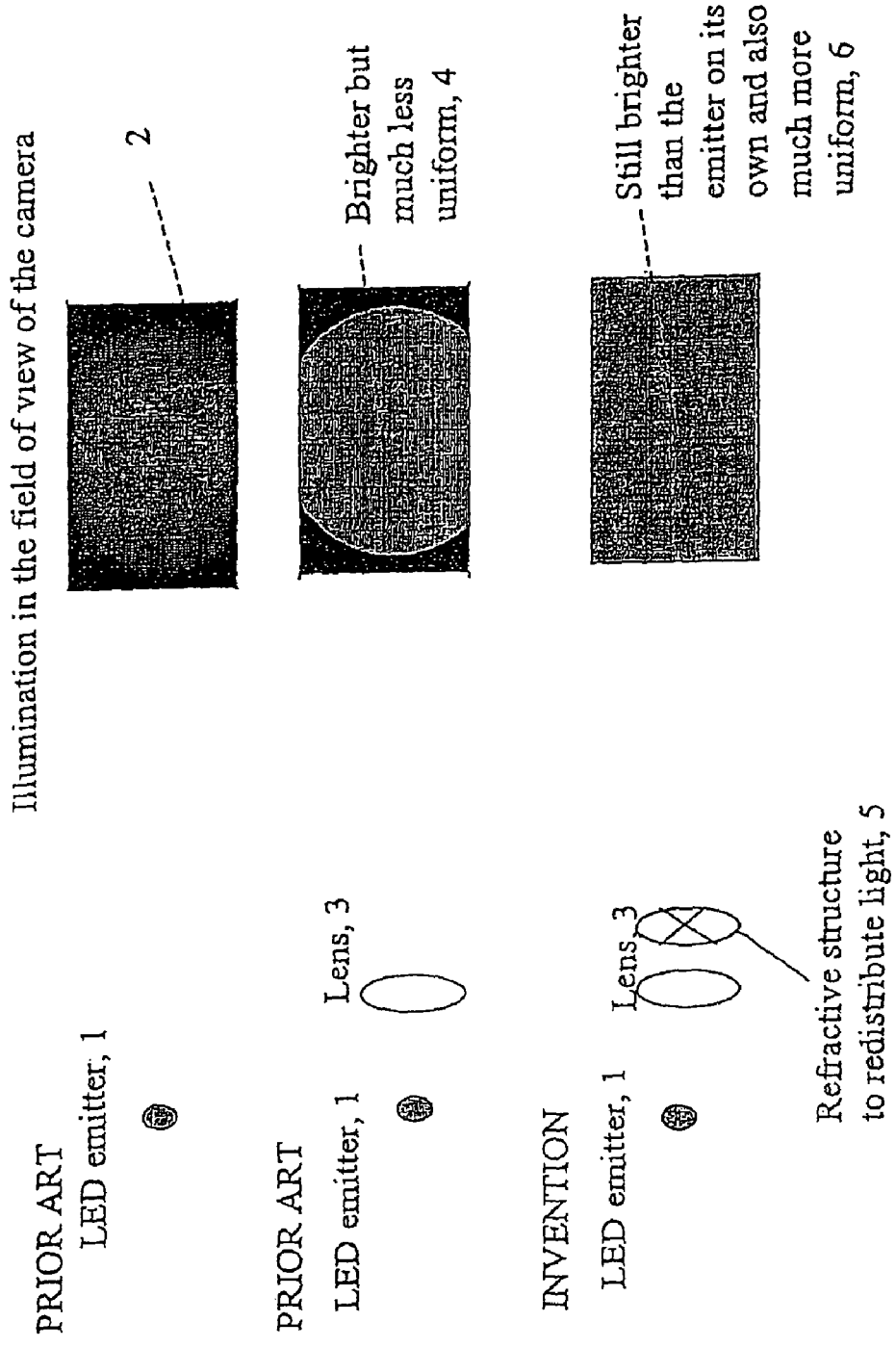
FIG. 1 is a diagram illustrating the concept of a set of embodiments of the invention.

Like reference numerals refer to like parts throughout the drawings.

FIG. 1 illustrates different light source arrangements at the left and, at the right, gives an illustration of the corresponding illumination distribution in the field of view of a camera with which the light sources might be used. In the top example in FIG. 1, a substantially Lambertian light source in the form of a light emitting diode (LED) emitter 1 without any optical elements is shown and the corresponding illumination distribution is illustrated at 2. As mentioned hereinbefore, the light flux through an arbitrary point in a plane in the camera field of view perpendicular to the camera optical axis is proportional to $\cos^4\theta$, where $\theta$ is the angle at the emitter 1 between the normal to the plane passing through the emitter and a line passing through the emitter 1 to the arbitrary point in the plane.

The middle example in FIG. 1 illustrates the effect of disposing a converging lens 3 in front of the LED emitter 1 and the resulting illumination distribution is illustrated at 4. In this case, the illumination in an inner portion of the camera field of view plane is much brighter but the illumination in an outer portion is lower because the lens 3 effectively redirects light away from the outer portion towards the inner portion. Thus, the illumination distribution is less uniform than without the lens 3 for wider fields of view.

The bottom example in FIG. 1 illustrates the addition of a refractive divergent element or "structure" 5 for redistributing light. The lens 3 is shown as being disposed between the emitter 1 and the structure 5 but the structure 5 may be disposed between the emitter 1 and the lens 3 in alternative arrangements. The structure 5 is arranged to pass some of the light from the lens 3 without having any substantial divergent effect but causes part of the light from the lens 3 to diverge outwardly so as to be directed to the outer portion of the camera field of view plane. The resulting illumination distribution is illustrated at 6. In this case, the inner region is brighter than for the emitter without any optical elements but the outer region is brighter than in the distributions 2 and 4 so that the illumination distribution is substantially more uniform.

FIG. 1 illustrates the use of the refractive structure 5 for partially redistributing light so as to provide greater uniformity of illumination in the camera field of view plane. However, other structures may be used for achieving such redistribution to provide other sets of embodiments of the invention. For example, diffractive structures such as holographic optical elements may be used in place of the refractive structure 5 and in place of the lens 3. Also, reflective structures for redistributing light may be used and an example of such an arrangement is described hereinafter.

Figure 2:
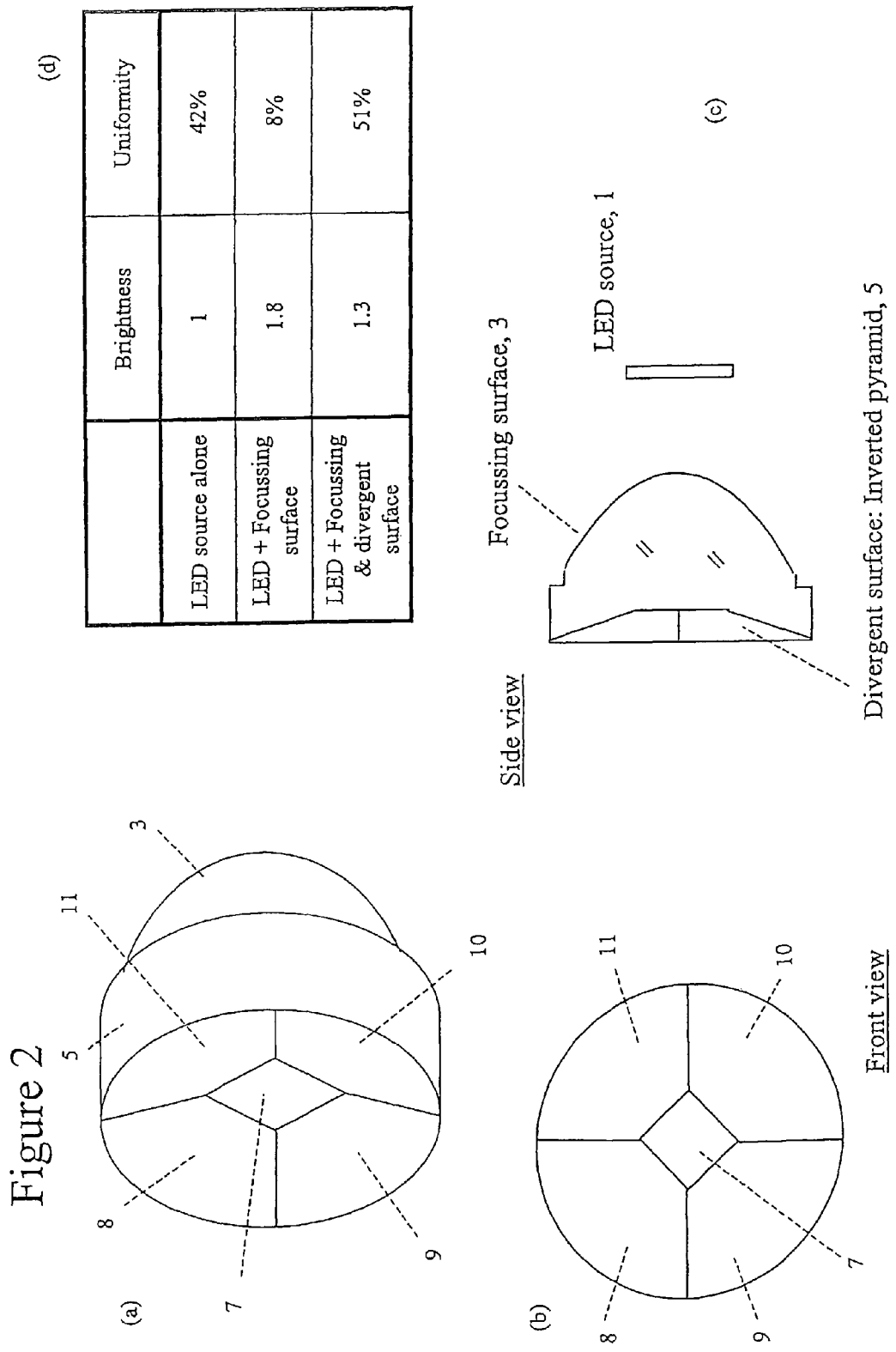
FIG. 2 is a diagram illustrating an optical device and a light source constituting first embodiments of the invention.

FIG. 2 illustrates an optical device in perspective view at (a) and in front view at (b). FIG. 2 also shows at (c) a side view of a light source including such a device and at (d) a table illustrating performance of the light source. The optical device is formed out of a single piece of refractive material, such as glass or moulded transparent plastics, but may alternatively be formed from a plurality of pieces. The optical device has a rear portion constituting the converging lens 3 and a front portion constituting the refractive divergent structure 5. The lens portion 3 is constituted by the convex rear "focussing" surface, which may be spherical, aspheric, asymmetric or anamorphic. The front surface of the device is multi-faceted and is in the shape of an open bottom inverted truncated pyramid forming a concave multi-faceted surface. The pyramid top surface 7 is flat and forms a non-divergent portion of the structure 5 so that light from the lens 3 passing through this portion is not substantially affected by the divergent structure 5. The concave surface further comprises flat faces 8 to 11 which are inclined with respect to the face 7 in order to diverge light from the lens 3 outwardly away from the optical axis of the optical element.

The optical element shown at (a) and (b) in FIG. 2 is shown as part of a light source at (c) which further comprises an LED emitter or source 1. Although the source 1 is shown adjacent the focussing surface constituting the lens 3, it may alternatively be disposed on the other side of the optical device so as to be adjacent the concave surface of the divergent structure 5.

Figure 3:
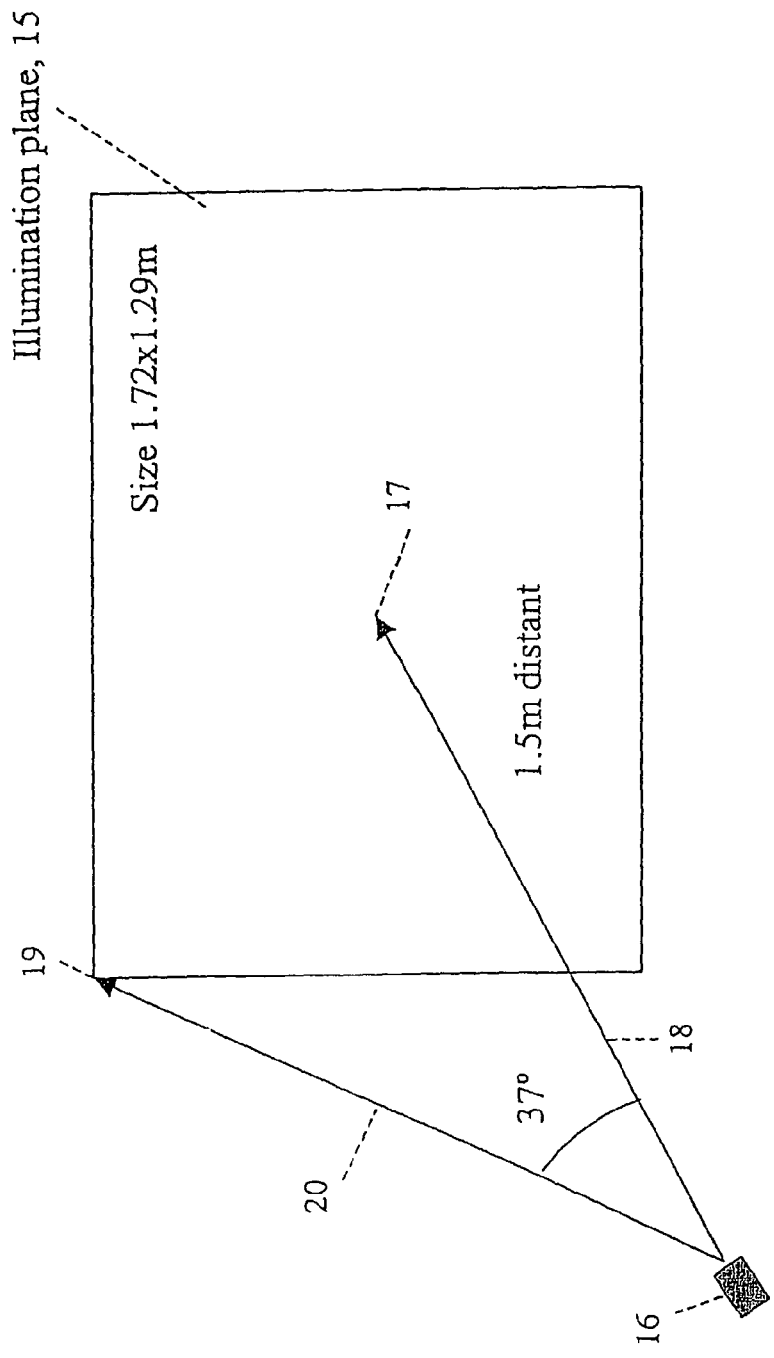
FIG. 3 is a diagram illustrating the geometry of a specific example used for calculating the performance of the illustrated embodiments.

The table shown at (d) in FIG. 2 illustrates the performance of an example of the light source when used as a flash unit for a camera with the geometry illustrated in FIG. 3. FIG. 3 illustrates an illumination plane 15 which is 1.72 m wide and 1.29 m high. The illumination plane 15 represents the field of view of a camera at a distance of 1.5 m from the flash unit 16. The optical device is 5.6 mm in diameter and 2.5 mm long and is disposed in front of the LED source, which is 2 mm in diameter. FIG. 3 illustrates the centre of the illumination plane at 17 with the normal 18 to the centre 17 of the plane 15 passing through the centre of the flash unit 16, which is pointing directly at the illumination plane 15. The light flux through each point of the plane 15 is substantially proportional to $\cos^4\theta$, where $\theta$ is the angle between the normal 18 and a line passing through the point on the plane 15 and the centre of the flash unit 16. The plane 15 is rectangular so that the lowest flux occurs at each corner, such as 19. The line from the corner 19 passing through the centre of the flash unit 16 is illustrated at 20 and forms an angle of 37° with the normal 18 at the flash unit 16. The "uniformity" illustrated in the table at (d) in FIG. 2 as a percentage is the ratio of the lowest flux, for example at the corner 19 of the plane 15, to the highest flux at the centre 17 of the plane 15.

As shown in the table in FIG. 2 and as described hereinbefore, the uniformity of the LED source 1 alone is 42% and the brightness is represented as unity. For the example illustrated in the middle of FIG. 1 with a lens 3 in front of the emitter 1, the relative brightness at the centre is 1.8 but the uniformity is 8%. For the light source shown at (c) in FIG. 2 and with the characteristics described hereinbefore, the relative brightness is 1.3 and the uniformity is 51%. The optical device and the light source including such a device therefore provide good brightness of illumination at the plane 15 while providing improved uniformity of illumination.

Although the elements 3 and 5 have been shown as being constituted by respective surfaces of a single piece of refractive material, they may be formed as separate elements. Also, although a single convergent element and a single divergent element have been described, either may comprise a plurality of separate elements formed on or in one or more pieces of refractive material. The optical device comprising the convergent and divergent elements may be used as an attachment for an existing light source. Alternatively, the optical device may be part of a light source. Further, either or both elements may be detachable.

The optical device may be used in or with a camera flash unit but may be used for other purposes, for example in torches or spotlights.

FIG. 4 illustrates an optical device which differs from that shown in FIG. 2 in that the multi-faceted concave surface of the divergent structure 5 comprises eight circular sector-shaped faces 31 to 38. Several of the faces 31 to 38 are themselves concave so as to form optically divergent substructures of the divergent structure 5. These concave faces effectively constitute sections of lenses and may be spherically concave, aspherically concave, anamorphically concave or cylindrically concave.

Some of the faces 31 to 38 may be flat so as to provide non-divergent and non-convergent portions of the structure 5. The concave faces may be arranged as sets of one or more faces where the sets have different radii of curvature and/or different centres of curvature. It is also possible for some of the faces 31 to 38 to be convergent.

Figure 5:
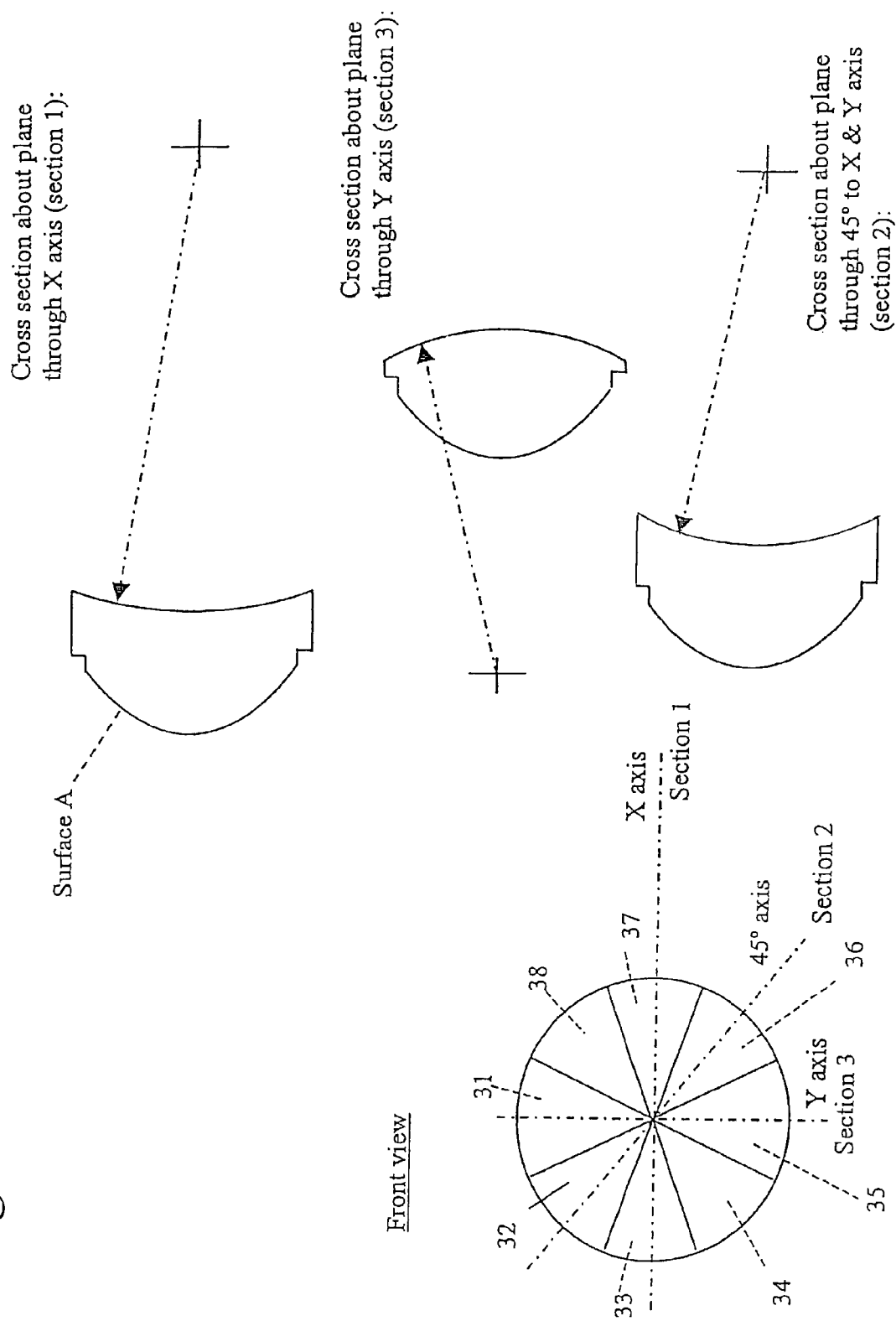
FIG. 5 is a diagram illustrating an example of the optical device of FIG. 4.

FIG. 5 illustrates a specific example of types of faces 31 to 38 of an optical device of the type shown in FIG. 4. The front view is shown again with section lines and the corresponding sections 1 to 3 are illustrated in FIG. 5. Section 1 is a section in a horizontal plane and illustrates that the faces 33 and 37 are segments of a common concave spherical or cylindrical surface. Section 2 is taken in a plane at 45° to the plane of section 1 and through the axis of the optical device. The section plane therefore passes through the faces 32 and 36 and has the same shape as an equivalent plane passing through the sections 34 and 38. Section 2 illustrates that the faces 32 and 36 are segments of a common concave surface, which may be spherical or cylindrical. The radius of curvature in the section 2 is smaller than that in the section 1.

Section 3 is taken on a vertical plane through the faces 31 and 35. As shown by the section drawing, the faces 31 and 35 are segments of a common convex surface, for example which may be circular or cylindrical. Thus, the faces 31 and 35 are optically convergent and may be used in the typical example where the desired field of view has a smaller height than width. The remaining faces are optically divergent for improving the uniformity of illumination. As illustrated in the table in FIG. 4, such an arrangement achieves a relative brightness of 1.4 and a uniformity of 54%.

The optical device shown in FIG. 6 differs from that shown in FIG. 2 in that the concave or diverging surface of the structure 5 comprises three sections of concave cylindrical lenses. In particular, the surface has a centre section 40 between upper and lower sections 41 and 42.

The section 40 comprises a rectangular section of a cylindrically concave surface, where the cylindrical axis is oriented horizontally. The sections 41 and 42 are segments of a common cylindrically concave surface where the cylindrical axis is oriented vertically. The radius of curvature of the section 40 is different from the radius of curvature of the sections 41 and 42. Surfaces 40-42 may not be wholly cylindrical.

Figure 7:
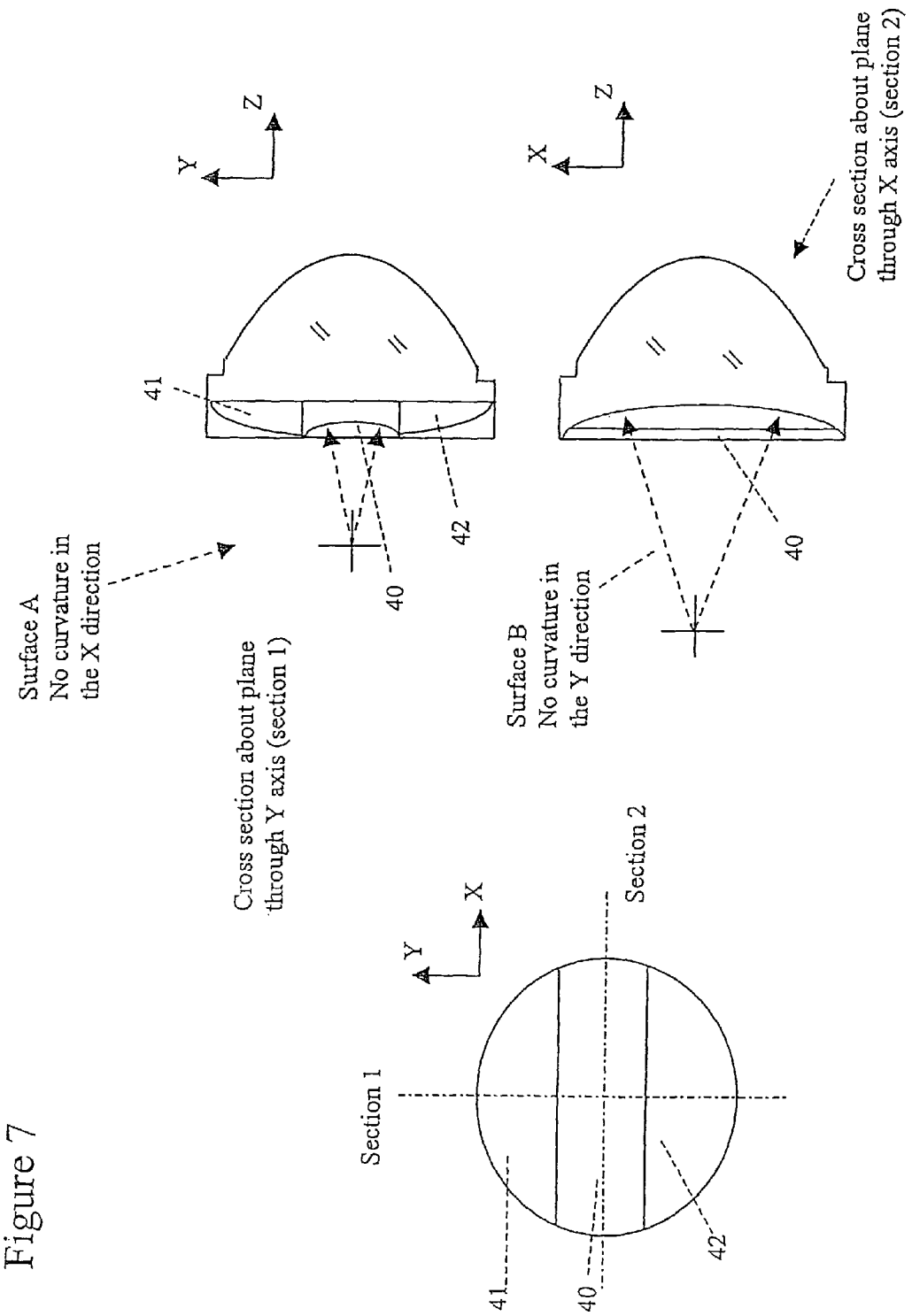
FIG. 7 is a diagram illustrating details of the optical device of FIG. 6.

FIG. 7 illustrates vertical and horizontal cross-sections of the optical device of FIG. 6. As shown in the table at (d) in FIG. 6, the light source shown at (c) achieves a relative brightness of 1.3 and a uniformity of 65%.

FIG. 8 illustrates two examples of how the convergent and divergent surfaces may be combined into a single composite surface performing both convergent and divergent optical functions. The upper part of FIG. 8 illustrates this for the embodiment shown in FIG. 2 whereas the lower part illustrates this for the embodiment shown in FIG. 7.

In the upper part of FIG. 8, the pyramidal divergent surface is effectively divided into the equivalent optical microstructure and superimposed on the structure of the focussing surface so as to form a combined converging and diverging surface 53 on the rear of the optical device. The front surface 54 is plane and so has no optical "power".

The rear surface 53 has a central portion 53a which has the same shape as the corresponding part of the surface 3 in FIG. 2 because the combination with the plane non-divergent face 7 has no effect. In other portions of the surface 53, such as 53b, the general outline of the surface is the same as the corresponding portion of the surface 3 but the detailed structure has triangular ridges corresponding to one of the inclined faces 8 to 11. This may be thought of as providing a microstructure in the region 53b incorporating the Fresnel equivalent of the inclined face.

The lower part of FIG. 8 illustrates the conversion from the optical device of FIG. 7 to the equivalent device with a combined rear surface 55. The shape of the rear surface 55 represents the combination of the shape of the focussing surface 3 with the shape of the divergent sections 40 to 42. A side view of the resulting optical device is shown at 56 and a plan view is shown at 57. Again, the front surface 54 is plane so as to have no optical power.

Figure 9:
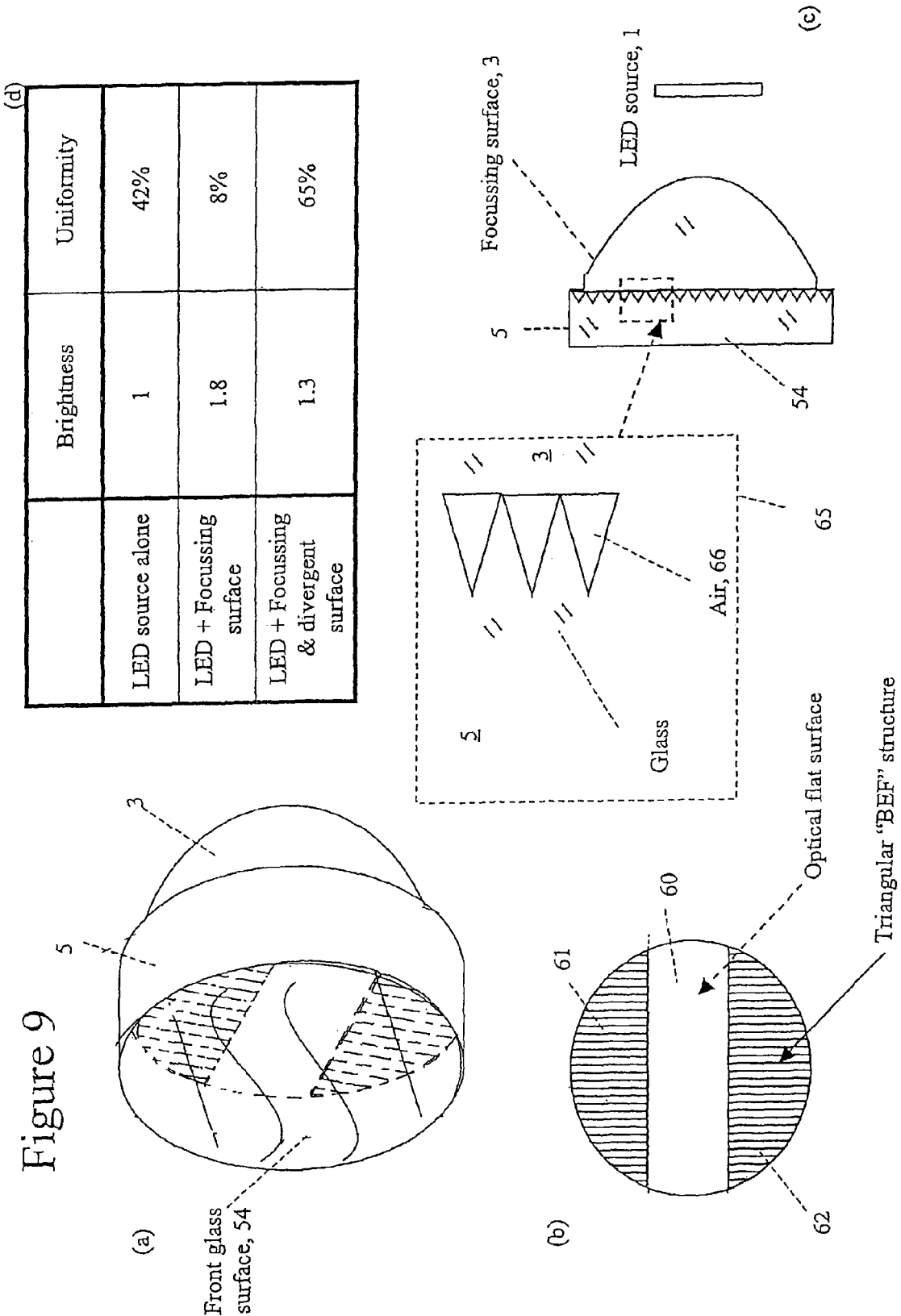
FIG. 9 is a diagram illustrating an optical device and a light source constituting fourth embodiments of the invention.

FIG. 9 illustrates an optical device which differs from that shown in FIG. 2 in that the diverging element 5 has a plane exterior face 54 and a profiled "interior" face comprising an optically flat section or surface 60 between sections 61 and 62 in the form of a triangular "brightness enhancing film" ("BEF") structure. In particular, the sections 61 and 62 of the internal surface have formed therein vertical grooves of inwardly pointing isosceles triangular cross-section as illustrated in the detail at 65. The elements 3 and 5 are formed in separate pieces of refractive material which are attached together, for example by optical cement having a lower refractive index than the glass, so that the front plane surface of the element 3 abuts against and effectively closes the grooves 66. The grooves thus form elongate pockets of triangular cross-section within the glass forming the elements 3 and 5. As mentioned above, this resembles a BEF structure of a type used for enhancing the brightness of displays.

The optically flat section 60 of the rear surface of the element 5 has no optical power whereas the adjacent BEF sections 61 and 62 act as divergent surfaces. The light source illustrated at (c) thus provides a relative brightness of 1.3 and a uniformity of 65%.

In alternative embodiments, the section 60 may be omitted, as may the sections 7 in FIGS. 2 and 40 in FIG. 6.

FIG. 10 illustrates an optical device comprising a planoconvex converging lens 3 and a separate diverging element 5 in the form of two microlens arrays formed integrally with each other. The microlens arrays 5 are disposed between the lens 3 and the LED source 1. Although the microlens arrays are shown as being identical, this is not essential and non-identical microlens arrays may be used. The microlens arrays are effectively spaced apart by the focal length of the microlenses of the rear array. Thus, the focal point of each microlens such as 70 is at the surface of the corresponding microlens, such as 71, of the front array (and vice versa where the microlens arrays are identical to each other).

Details of segments of the front and rear microlens arrays are illustrated at 72 and 73. The microlenses are of rectangular shape and are convex with spherical surfaces. As an alternative, the microlens arrays may be formed inside a refractive medium, in which case the microlens surfaces would be concave.

This arrangement achieves a relative brightness of 1.4 and a uniformity of 56%.

Figure 11:
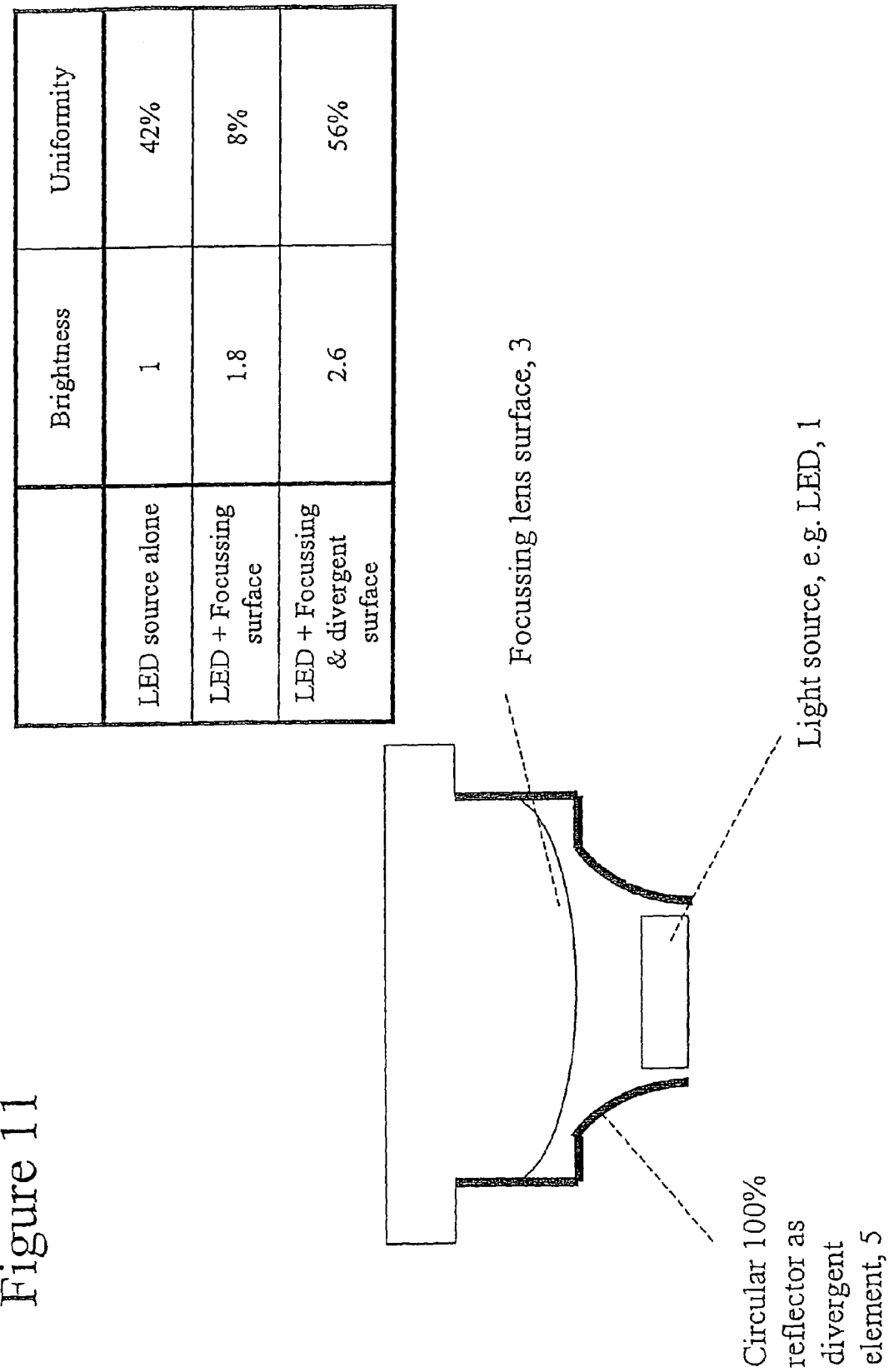
FIG. 11 is a diagram illustrating an optical device and a light source constituting fifth embodiments of the invention.

FIG. 11 illustrates an optical device and light source in which the converging or focussing element comprises a plano-convex lens 3 and the diverging element 5 comprises a reflector disposed with respect to the light source 1 as illustrated in FIG. 11. The reflector 5 effectively comprises part of a torus with a reflective exterior surface. The reflector 5 is thus circularly symmetrical about the optical axis 100 of the light source. The reflector 5 also has a circular arc-shaped cross-section in each plane containing the axis 100.

The reflector preferably reflects substantially 100% of incident light and is preferably a specular reflector. As possible alternatives, the reflector may be partially specular, semi-reflecting or diffuse.

The illustrated embodiment achieves a relative brightness of 2.6 and a uniformity of 56%.

Although the refractive, convergent and divergent elements described hereinbefore have been illustrated as lenses of glass or plastics material having fixed optical properties, it is possible to replace one or more "fixed" lens surfaces with "variable" lens surfaces so as to provide a variable field of illumination or a "zoom" function. Such a variable arrangement may be useful for cameras or other devices with variable fields of view. For example, in the case of a camera with a digital or optical zoom capability, a variable flash unit may be provided for manually or automatically adapting the field of illumination to the camera field of view. Such an arrangement allows improved illumination for narrower fields of view while providing improved illumination for wider fields of view.

Such variable light sources may be formed by embodying one or more of the optical elements as one or more liquid crystal lenses. For example, graded refractive index (GRIN) lenses or modally addressed liquid crystal lenses may be used in place of one or more fixed lens or lens surface. Such variable lenses may be controlled by the appropriate micro-patterning or by electrical control, although continuous surfaces are easier to manufacture than discontinuous ones.

In an alternative arrangement, the glass or plastics forming one or more of the lenses may have a refractive index which is matched to one axis of a liquid crystal. The surface of the lens is provided with a transparent electrode layer, for example of indium tin oxide (ITO). The liquid crystal layer is disposed between this and another ITO electrode formed on an optically flat piece of glass. By varying an applied electrical field between the ITO electrodes, the liquid crystal director direction can be changed so that the relative refractive index between the surface and air can be altered. This allows the optical power of the variable lens to be controlled so as to provide control of the illumination field. Polarised light emitters may be used as appropriate.

The invention claimed is:

1. An optical device for directing light from a light emitter located at a first predetermined position with respect to the device to a predetermined two-dimensional region of space located at a second predetermined position with respect to the device, the device comprising:

a first optical element defining a rear portion of the optical device for converging light incident thereon towards an inner portion of the region, and a refractive second optical element defining a front portion of the optical device for diverging part of the light incident thereon outwardly towards at least one outer portion of the region, the second element having a concave multi-faceted surface comprising plane facets in the shape of an open-base inverted truncated pyramid.

2. An optical device for directing light from a light emitter located at a first predetermined position with respect to the device to a predetermined two-dimensional region of space located at a second predetermined position with respect to the device, the device comprising:

a first optical element defining a rear portion of the optical device for converging light incident thereon towards an inner portion of the region, and a refractive second optical element defining a front portion of the optical device for diverging part of the light incident thereon outwardly towards at least one outer portion of the region, the second element having a multi-faceted surface comprising a plurality of contiguous sector-shaped facets, at least some of which are concave.

3. The device of claim 2, wherein the concave facets have at least two different radii of curvature.

4. The device of claim 2 or 3, wherein the concave facets have at least two different centers of curvature.

5. The device of claim 2 or 3, wherein some of the facets are convex.

6. The device of claim 2 or 3, wherein at least one of the facets is planar in configuration.

7. The device of claim 2 or 3, wherein at least some of the facets are cylindrical in configuration.

8. The device of claim 1 or 2, wherein the first and second elements are formed in a single piece of refractive material.

9. The device of claim 8, wherein the first and second elements are formed in first and second surfaces of the piece.

10. The device of claim 1 or 2, wherein at least one of the first and second elements has a controllable variable optical performance for varying the size of the predetermined two-dimensional region of space.

11. The device of claim 10, wherein the at least one of the first and second elements comprises a liquid crystal lens.

12. The device of claim 10, wherein the at least one of the first and second elements comprises a lens which is substantially index-matched to an axis of a liquid crystal layer whose optical axis azimuth is controllable.

13. The device of claim 1 or 2, wherein the second element is arranged to diverge the part of the incident light towards a plurality of outer portions of the region.

14. The device of claim 1 or 2, wherein the region is generally rectangular.

15. The device of claim 13, wherein the region is generally rectangular and the outer portions comprise corner portions of the generally rectangular region.

16. The device of claim 1 or 2, wherein the first element is a focusing element.

17. The device of claim 1 or 2, wherein the first element is a refractive element.

18. The device of claim 17, wherein the first element has a convex surface.

19. The device of claim 1 or 2, wherein the first element comprises a holographic optical element.

20. A light source comprising the device of claim 1 or 2, and at least one light emitter.

21. The light source of claim 20, wherein the first element is disposed in a light path between the at least one light emitter and the second element.

22. The light source of claim 20, wherein the at least one light emitter comprises a Lambertian emitter.

23. The light source of claim 22, wherein the Lambertian emitter comprises at least one light emitting diode.

24. The light source of claim 20, further comprising a camera flash unit.

25. An apparatus comprising the light source of claim 24 and a camera.

26. The apparatus of claim 25, further comprising a mobile or cellular telephone or a mobile personal digital assistant (PDA).

27. An optical device for directing light from a light emitter located at a first predetermined position with respect to the device to a predetermined two-dimensional region of space located at a second predetermined position with respect to the device,
the device comprising:
a first optical element defining a rear portion of the optical device for converging light incident thereon towards an inner portion of the region, and
a refractive second optical element defining a front portion of the optical device for diverging part of the light incident thereon outwardly towards at least one outer portion of the region, the second element having a face divided into an elongate portion disposed between first and second diverging portions,
wherein at least one of the first and second elements has a controllable variable optical performance for varying the size of the predetermined two-dimensional region of space, and
wherein the at least one of the first and second elements comprises a liquid crystal lens.

28. An optical device for directing light from a light emitter located at a first predetermined position with respect to the device to a predetermined two-dimensional region of space located at a second predetermined position with respect to the device,
the device comprising:
a first optical element defining a rear portion of the optical device for converging light incident thereon towards an inner portion of the region, and
a refractive second optical element defining a front portion of the optical device for diverging part of the light incident thereon outwardly towards at least one outer portion of the region, the second element having a face divided into an elongate portion disposed between first and second diverging portions,
wherein at least one of the first and second elements has a controllable variable optical performance for varying the size of the predetermined two-dimensional region of space, and
wherein the at least one of the first and second elements comprises a lens which is substantially index-matched to an axis of a liquid crystal layer whose optical axis azimuth is controllable.

29. An optical device for directing light from a light emitter located at a first predetermined position with respect to the device to a predetermined two-dimensional region of space located at a second predetermined position with respect to the device,
the device comprising:
a first optical element defining a front portion of the optical device for converging light incident thereon towards an inner portion of the region, and
a reflective second optical element defining a rear portion of the optical device for diverging part of the light incident thereon outwardly towards at least one outer portion of the region via the first optical element,
wherein the first element has a controllable variable optical performance for varying the size of the predetermined two-dimensional region of space, and
wherein the first element comprises a liquid crystal lens.

30. An optical device for directing light from a light emitter located at a first predetermined position with respect to the device to a predetermined two dimensional region of space located at a second predetermined position with respect to the device,
the device comprising:
a first optical element defining a front portion of the optical device for converging light incident thereon towards an inner portion of the region, and
a reflective second optical element defining a rear portion of the optical device for diverging part of the light incident thereon outwardly towards at least one outer portion of the region via the first optical element,
wherein the second element is specularly reflective,
wherein the first element has a controllable variable optical performance for varying the size of the predetermined two-dimensional region of space, and
wherein the first element comprises a liquid crystal lens.

31. An optical device for directing light from a light emitter located at a first predetermined position with respect to the device to a predetermined two dimensional region of space located at a second predetermined position with respect to the device,
the device comprising:
a first optical element defining a front portion of the optical device for converging light incident thereon towards an inner portion of the region, and
a reflective second optical element defining a rear portion of the optical device for diverging part of the light incident thereon outwardly towards at least one outer portion of the region via the first optical element,
wherein the first element has a controllable variable optical performance for varying the size of the predetermined two-dimensional region of space, and
wherein the first element comprises a lens which is substantially index-matched to an axis of a liquid crystal layer whose optical axis azimuth is controllable.

32. An optical device for directing light from a light emitter located at a first predetermined position with respect to the device to a predetermined two dimensional region of space located at a second predetermined position with respect to the device,
the device comprising:
a first optical element defining a front portion of the optical device for converging light incident thereon towards an inner portion of the region, and
a reflective second optical element defining a rear portion of the optical device for diverging part of the light incident thereon outwardly towards at least one outer portion of the region via the first optical element,
wherein the second element is specularly reflective,
wherein the first element has a controllable variable optical performance for varying the size of the predetermined two-dimensional region of space, and
wherein the first element comprises a lens which is substantially index-matched to an axis of a liquid crystal layer whose optical axis azimuth is controllable.

33. An optical device for directing light from a light emitter located at a first predetermined position with respect to the device to a predetermined two-dimensional region of space located at a second predetermined position with respect to the device,
the device comprising:
a first optical element defining a rear portion of the optical device for converging light incident thereon towards an inner portion of the region, and a refractive second optical element defining a front portion of the optical device for diverging part of the light incident thereon outwardly towards at least one outer portion of the region, the second element having a face divided into an elongate portion disposed between first and second diverging portions, wherein the first element comprises a holographic optical element.

34. An optical device for directing light from a light emitter located at a first predetermined position with respect to the device to a predetermined two dimensional region of space located at a second predetermined position with respect to the device, the device comprising:

a first optical element defining a front portion of the optical device for converging light incident thereon towards an inner portion of the region, and a reflective second optical element defining a rear portion of the optical device for diverging part of the light incident thereon outwardly towards at least one outer portion of the region via the first optical element, wherein the first element comprises a holographic optical element.

35. An apparatus comprising a light source and a camera, the light source comprising an optical device and at least one light emitter, the optical device for directing light from a light emitter located at a first predetermined position with respect to the device to a predetermined two-dimensional region of space located at a second predetermined position with respect to the device comprising:

a first optical element defining a rear portion of the optical device for converging light incident thereon towards an inner portion of the region, and a refractive second optical element defining a front portion of the optical device for diverging part of the light incident thereon outwardly towards at least one outer portion of the region, the second element having a face divided into an elongate portion disposed between first and second diverging portions, the light source further comprising a camera flash unit, and the apparatus further comprising a mobile or cellular telephone or a mobile personal digital assistant (PDA).

36. An apparatus comprising a light source and a camera, the light source comprising an optical device and at least one light emitter, the optical device for directing light from a light emitter located at a first predetermined position with respect to the device to a predetermined two dimensional region of space located at a second predetermined position with respect to the device comprising:

a first optical element defining a front portion of the optical device for converging light incident thereon towards an inner portion of the region, and a reflective second optical element defining a rear portion of the optical device for diverging part of the light incident thereon outwardly towards at least one outer portion of the region via the first optical element, the light source further comprising a camera flash unit, and the apparatus further comprising a mobile or cellular telephone or a mobile personal digital assistant (PDA).

* * * * *